US007049610B2

United States Patent
Muraki et al.

(10) Patent No.: US 7,049,610 B2
(45) Date of Patent: May 23, 2006

(54) CHARGED PARTICLE BEAM EXPOSURE METHOD, CHARGED PARTICLE BEAM EXPOSURE APPARATUS, AND DEVICE MANUFACTURING METHOD

(75) Inventors: Masato Muraki, Tokyo (JP); Haruo Yoda, Tokyo (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 35 days.

(21) Appl. No.: 10/885,665

(22) Filed: Jul. 8, 2004

(65) Prior Publication Data

US 2005/0006603 A1   Jan. 13, 2005

(30) Foreign Application Priority Data

Jul. 8, 2003   (JP) .............................. 2003-193835

(51) Int. Cl.
*H01J 37/305* (2006.01)
(52) U.S. Cl. ............................ 250/492.23; 250/492.22; 250/398
(58) Field of Classification Search ........... 250/492.23, 250/492.22, 398
See application file for complete search history.

(56) References Cited

U.S. PATENT DOCUMENTS

| 5,834,783 | A | 11/1998 | Muraki et al. ............... 250/398 |
| 5,949,078 | A * | 9/1999 | Ooaeh et al. ............. 250/492.2 |
| 5,973,332 | A | 10/1999 | Muraki et al. ........... 250/492.2 |
| 6,166,387 | A | 12/2000 | Muraki et al. ............ 250/492.2 |
| 6,274,877 | B1 | 8/2001 | Muraki ................... 250/492.23 |
| 6,323,499 | B1 | 11/2001 | Muraki et al. ......... 250/492.22 |
| 6,483,120 | B1 | 11/2002 | Yui et al. .................. 250/491.1 |
| 6,515,409 | B1 | 2/2003 | Muraki et al. ........... 313/359.1 |
| 2002/0008207 | A1 | 1/2002 | Muraki et al. ............... 250/398 |
| 2003/0122087 | A1 | 7/2003 | Muraki et al. ........... 250/492.2 |

FOREIGN PATENT DOCUMENTS

JP   9-245708   9/1997

* cited by examiner

*Primary Examiner*—Kiet T. Nguyen
(74) *Attorney, Agent, or Firm*—Fitzpatrick, Cella, Harper & Scinto

(57) ABSTRACT

In a charged particle beam exposure method of applying/not applying charged particle beams to expose a substrate by deflecting the charged particle beams to move the charged particle beams on a blanking aperture stop, the size of the charged particle beams on the blanking aperture stop is made larger than the size of the blanking aperture stop.

6 Claims, 8 Drawing Sheets

IMAGE ON WAFER
(d ≠ 0)

IMAGE ON WAFER
(d = 0)

CHARGED PARTICLE BEAM EXPOSURE METHOD, CHARGED PARTICLE BEAM EXPOSURE APPARATUS, AND DEVICE MANUFACTURING METHOD

FIELD OF THE INVENTION

The present invention relates to a charged particle beam exposure method, a charged particle beam exposure apparatus, and a device manufacturing method, which expose a substrate such as a wafer to a fine pattern with a charged particle beam. The charged particle beam exposure method, charged particle beam exposure apparatus, and device manufacturing method of this type are mainly used to expose to light a device bearing a fine pattern of, for example, a semiconductor integrated circuit in a charged particle beam exposure apparatus such as an electron beam exposure apparatus, ion beam exposure apparatus, or the like.

BACKGROUND OF THE INVENTION

As an exposure apparatus which exposes a substrate to a fine pattern of, for example, a semiconductor chip such as an IC or LSI, liquid crystal panel, CCD, thin-film magnetic head, micromachine, or the like, there is known a charged particle beam exposure apparatus which draws a pattern using an electron beam or ion beam, such as an electron beam exposure apparatus (see Japanese Patent Laid-Open No. 9-245708), ion beam exposure apparatus, or the like.

Figure 5A:
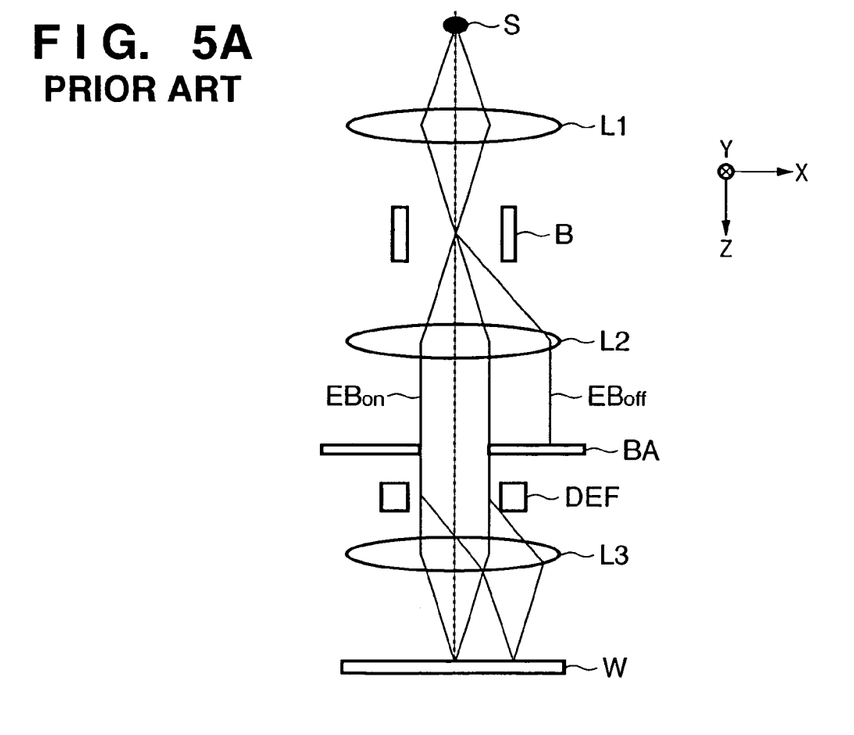
FIGS. 5A and 5B are views for explaining a conventional raster scanning electron beam exposure apparatus.

FIG. 5A shows a conventional raster scanning electron beam exposure apparatus. In FIG. 5A, reference symbol S denotes an electron source which emits an electron beam, and B, a blanker. An electron beam from the electron source S forms an image of the electron source S at the same position as the blanker B through an electron lens L1. The image of the electron source is reduced and projected onto a wafer W through a reduction electron optical system comprising electron lenses L2 and L3. The blanker B is an electrostatic deflector which is located at the same position as the image of the electron source S formed through the electron lens L1. The blanker B controls whether to irradiate the wafer with an electron beam. More specifically, when the wafer is not to be exposed to an electron beam, the blanker B deflects the electron beam, and a blanking aperture stop BA located on the pupil of the reduction electron optical system cuts off the deflected electron beam (i.e., an electron beam $EB_{off}$). On the other hand, when the wafer is to be exposed to an electron beam, an electron beam $EB_{on}$ having passed through the blanking aperture stop BA is controlled by an electrostatic deflector DEF to scan the wafer W.

Figure 5B:
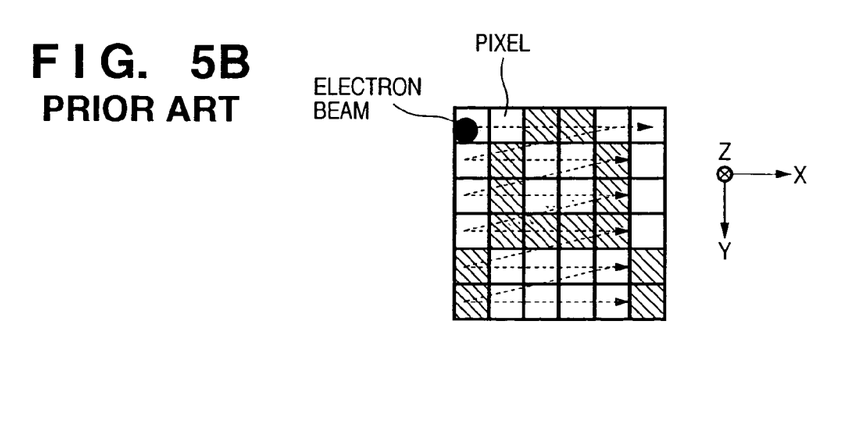

A method of drawing on the wafer by raster scanning will be described with reference to FIG. 5B. For example, to draw a pattern of a character "A", a drawing region is divided into a plurality of pixels. While the deflector DEF moves an electron beam to perform scanning in the X direction, the blanker B performs control such that each pixel constituting part of the pattern (gray portion) is irradiated with the electron beam and each of the remaining pixels shields the electron beam. When the scanning in the X direction ends, the electron beam is stepped in the Y direction, and the scanning in the X direction restarts. Electron beam irradiation is controlled during the scanning, thereby drawing the pattern.

Figure 6A:
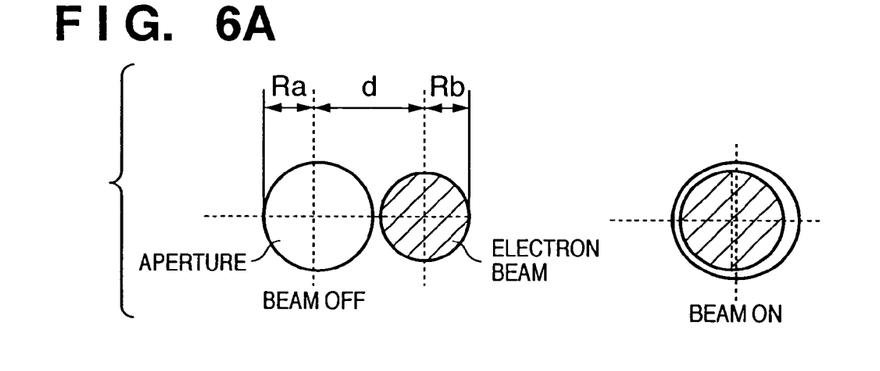
FIGS. 6A to 6D are charts for explaining a pixel intensity distribution obtained by conventional raster scanning.

As shown in FIG. 6A, when the blanker B switches the beam state from an electron beam OFF state to an electron beam ON state to irradiate the wafer W with an electron beam, the electron beam is made to move on the blanking aperture stop BA by the blanker B and passes through the aperture of the blanking aperture stop BA.

Figure 6B:
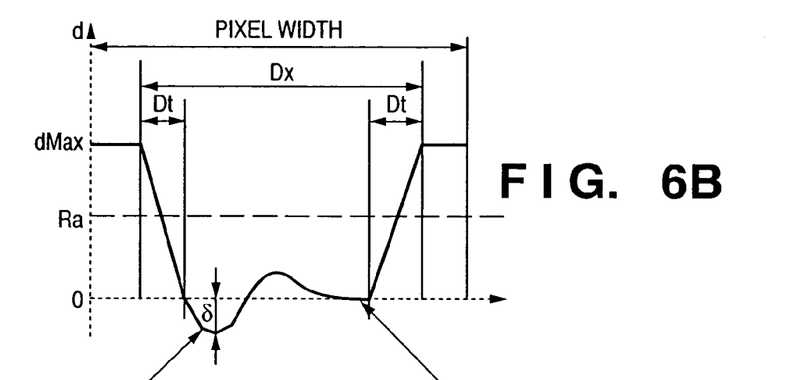
Figure 6C:
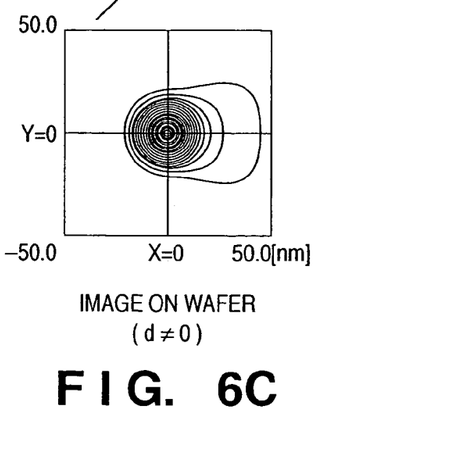
Figure 6D:
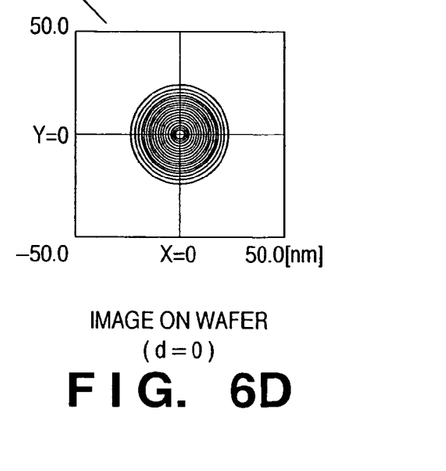

In the conventional apparatus, the diameter of electron beam is smaller than the aperture diameter of the blanking aperture stop, and a driver which drives the blanker B serving as the electrostatic deflector may cause an overshoot. For this reason, even in the beam ON state, the center of the electron beam fluctuates about the center of the aperture ($d \neq 0$) until it stabilizes at the center of the aperture, as shown in FIG. 6B. An image of an electron beam which comes incident on the wafer at a position shifted from the center of the aperture does not have a desired axisymmetric intensity distribution as shown in FIG. 6D but has a distorted intensity distribution as shown in FIG. 6C. Accordingly, it is difficult to form a desired fine pattern on the wafer.

SUMMARY OF THE INVENTION

The present invention has been made in consideration of the above-mentioned conventional drawback, and has as its object to provide a charged particle beam exposure method, charged particle beam exposure apparatus, and device manufacturing method which can perform exposure to a desired pattern.

According to the first aspect of the present invention, there is provided a charged particle beam exposure method of controlling irradiation of a substrate with a charged particle beam to expose the substrate by deflecting the charged particle beam to move the charged particle beam on a blanking aperture stop, wherein a size of the charged particle beam on the blanking aperture stop is made larger than a size of an aperture of the blanking aperture stop.

According to the second aspect of the present invention, there is provided a charged particle beam exposure apparatus, comprising a charged particle beam source which emits a charged particle beam, a first electron optical system which forms an intermediate image of the charged particle beam source, and a second electron optical system which projects the intermediate image formed by the first electron optical system onto the substrate, the first electron optical system having an electron lens, a deflector which deflects a charged particle beam that passes through the electron lens, and a blanking aperture stop having an aperture which passes a charged particle beam not deflected by the deflector, wherein a size of the charged particle beam on the blanking aperture stop is made larger than a size of an aperture of the blanking aperture stop.

According to the third aspect of the present invention, there is provided a charged particle beam exposure apparatus, comprising a charged particle beam source which emits a charged particle beam, a deflector which deflects the charged particle beam, and a blanking aperture stop having an aperture which passes a charged particle beam not deflected by the deflector, wherein a cross-sectional area of the charged particle beam on the blanking aperture stop is made larger than an area of the aperture of the blanking aperture stop.

According to the fourth aspect of the present invention, there is provided a device manufacturing method comprising an exposure step of exposing a substrate to a pattern using the above-mentioned charged particle beam exposure apparatus, and a development step of developing the substrate which has been exposed to the pattern in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

As an example of a charged particle beam exposure apparatus according to a preferred embodiment of the present invention, this embodiment will illustrate an electron beam exposure apparatus. Note that this embodiment can be applied to not only exposure apparatuses using electron beams but also ones using ion beams.

<Explanation of Components of Electron Beam Exposure Apparatus>

Figure 1:
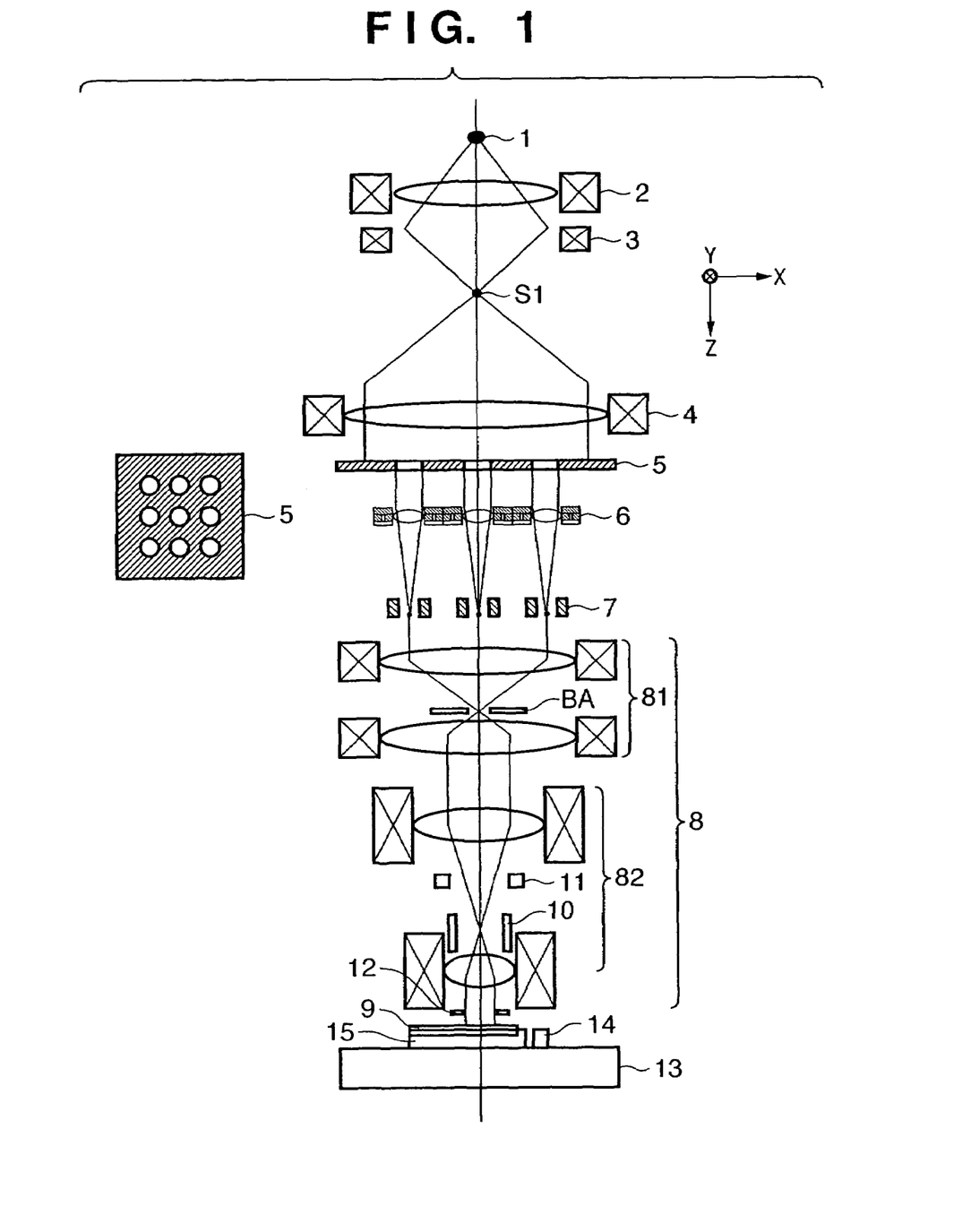
FIG. 1 is a view schematically showing the main part of an electron exposure apparatus according to an embodiment of the present invention.

FIG. 1 is a view schematically showing the main part of an electron beam exposure apparatus according to an embodiment of the present invention. In FIG. 1, an electron beam generated by an electron gun (not shown) forms a crossover image 1 (to be referred to as an electron source 1 hereinafter). An electron beam emitted from the electron source 1 passes through a beam shaping optical system 2 and forms an image SI of the electron source 1. At this time, a first stigmator 3 serving as a magnetic octupole stigmator can cause astigmatism in the image SI. This astigmatism can correct any astigmatism in an electron beam image projected onto a wafer 9 (to be described later).

The electron beam from the image SI becomes almost parallel through a collimator lens 4. The almost parallel electron beam comes incident on an aperture array 5 having a plurality of apertures. The aperture array 5 divides the electron beam into a plurality of electron beams which correspond to the plurality of apertures in a one-to-one relationship. The plurality of electron beams derived from the aperture array 5 form intermediate images of the image SI through an electrostatic lens array 6 having a plurality of electrostatic lenses. A blanker array 7 which has a plurality of blankers serving as electrostatic deflectors is arranged on the plane of the intermediate images.

A reduction electron optical system 8 comprising two symmetric magnetic doublet lenses 81 and 82 is provided downstream of the intermediate image plane. The plurality of intermediate images are projected onto the wafer 9. At this time, electron beams deflected by the blanker array 7 are shielded by a blanking aperture stop BA and thus do not come incident on the wafer 9. On the other hand, electron beams not deflected by the blanker array 7 are not shielded by the blanking aperture stop BA and thus come incident on the wafer 9. That is, the blanker array 7 individually controls to apply/not to apply (performs on-off control for) the plurality of electron beams derived from the aperture array 5 to the wafer 9.

Figure 2:
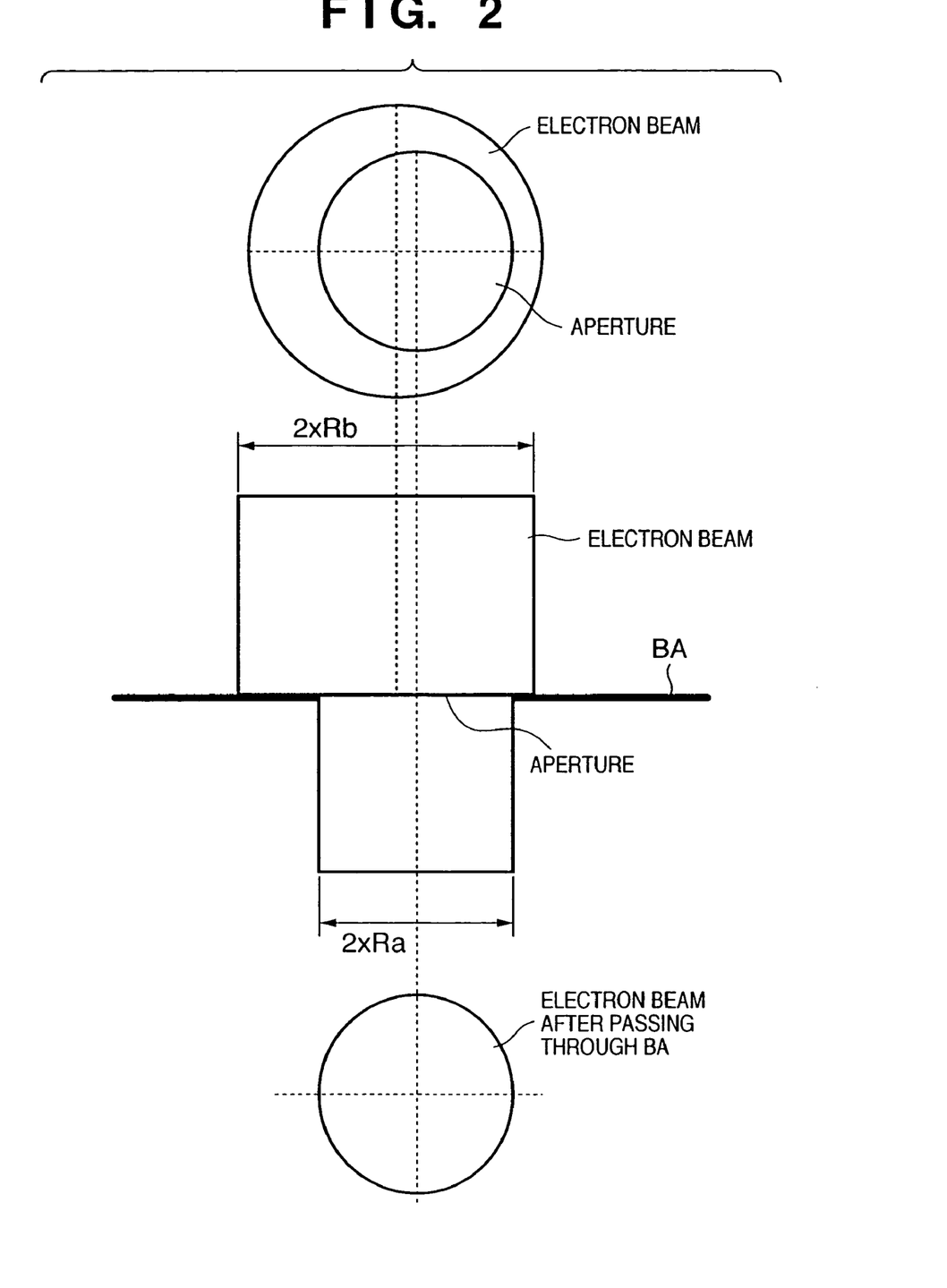
FIG. 2 is a view for explaining electron beams and a blanking aperture stop according to this embodiment.

Electron beams having passed through the apertures of the aperture array 5 form an image on the blanking aperture stop BA. In the electron optical system of the electron beam exposure apparatus according to this embodiment, the image of the apertures of the aperture array 5, formed on the blanking aperture stop BA, is made larger than the aperture of the blanking aperture stop BA. That is, as shown in FIG. 2, the size of the electron beams on the blanking aperture stop BA (2×Rb) is made larger than that of the aperture of the blanking aperture stop BA (2×Ra). It is more preferable to make the size of the electron beams on the blanking aperture stop BA larger than the sum of the size of the aperture of the blanking aperture stop BA and a variation δ (see FIG. 6B) on the blanking aperture stop BA of the electron beams. The cross-sectional area on the blanking aperture stop BA of the electron beams may be made larger than the area of the aperture of the blanking aperture stop BA. In this case, even if the center of the electron beams is not located at the center of the aperture of the blanking aperture stop BA, the center of the electron beams having passed through the blanking aperture stop BA is located at the center of the aperture of the blanking aperture stop BA. Thus, a desired image is projected onto the wafer 9, and the wafer 9 is exposed to a desired pattern. According to this embodiment, any of the plurality of electron beams derived from the aperture array 5 passes through the single blanking aperture stop BA and comes incident on the wafer 9. Variations in size between the plurality of apertures formed in the aperture array 5 can be smoothed, and variations in incident angles generated when the electron beams come incident on the blanker array 7 can be smoothed. Accordingly, a desired image is projected onto the wafer 9, and the wafer 9 is exposed to a desired pattern.

A deflector 10 which simultaneously displaces a plurality of electron beams in the X and Y directions to desired positions, a second stigmator 11 serving as an electrostatic octupole stigmator which simultaneously adjusts any astigmatism of the plurality of electron beams, and a focus coil 12 which simultaneously adjusts the focuses of the plurality of electron beams are arranged in the lower doublet lens 82. Reference numeral 13 denotes an X-Y stage 13 on which the wafer 9 is mounted and which can move in the X and Y directions perpendicular to the optical axis. An electrostatic chuck 15 for chucking the wafer 9 and a semiconductor detector 14 for measuring the shape of electron beams which has a single knife edge extending in the X and Y directions on the electron beam incident side are arranged on the stage. The X-direction shape of electron beams can be measured using a change in output of the semiconductor detector 14 when the electron beams are moved to perform scanning in the Y direction with respect to the single knife edge extending in the X direction. The Y-direction shape of the electron beams can be measured using a change in output of the semiconductor detector 14 when the electron beams are moved to perform scanning in the X direction with respect to the single knife edge extending in the Y direction.

Note that this embodiment uses the second stigmator 11 to correct any astigmatism which changes upon deflecting electron beams and uses the first stigmator 3 to correct any astigmatism which does not change upon deflecting the electron beams such as one caused by lens decentering in apparatus assembly. The first stigmator 3 may be arranged at any position on the optical axis but is preferably arranged between the electron source 1 and the aperture array 5.

<Explanation of System Configuration and Exposure Method>

Figure 3:
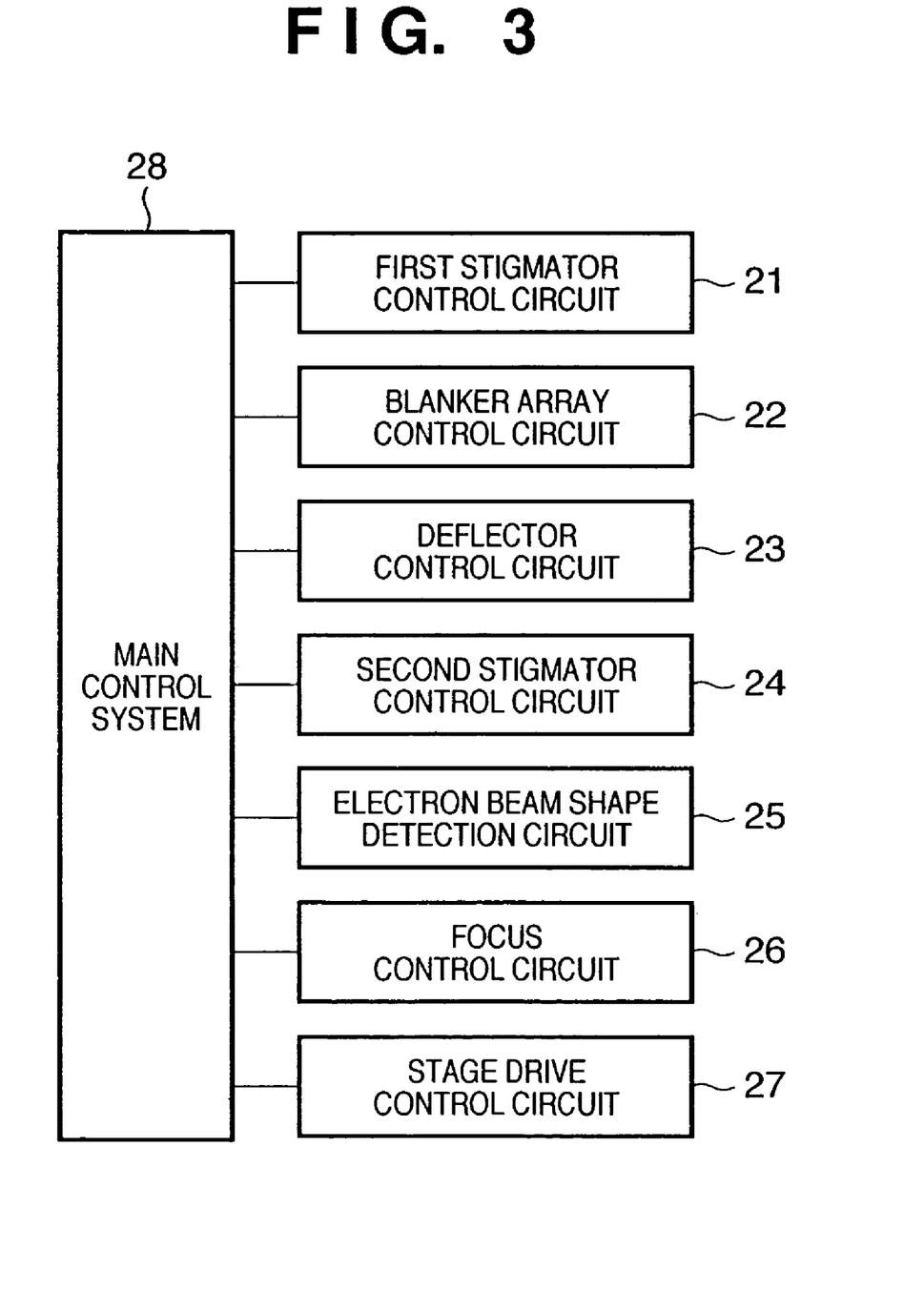
FIG. 3 is a diagram for explaining a system according to this embodiment.

FIG. 3 is a diagram of the configuration of a system according to this embodiment. A first stigmator control circuit 21 is a control circuit which controls astigmatism of the electron source image SI by adjusting a difference in focal length in a direction perpendicular to the first stigmator 3. A blanker array control circuit 22 is a control circuit which individually controls the plurality of blankers of the blanker array 7. A deflector control circuit 23 is a control circuit which controls the deflector 10. A second stigmator control circuit 24 is a control circuit which controls astigmatism of the reduction electron optical system 8 by adjusting a difference in focal length in a direction perpendicular to the second stigmator 11. An electron beam shape detection circuit 25 is a detection circuit which processes signals from the semiconductor detector 14. A focus control circuit 26 is a control circuit which controls the focal position of the reduction electron optical system 8 by adjusting the focal length of the focus coil 12. A stage drive control circuit 27 is a control circuit which controls to drive the X-Y stage 13 in cooperation with a laser interferometer (not shown) which detects the position of the X-Y stage 13. A main control system 28 controls the above-mentioned plurality of control circuits and manages the entire electron beam exposure apparatus.

Figure 4:
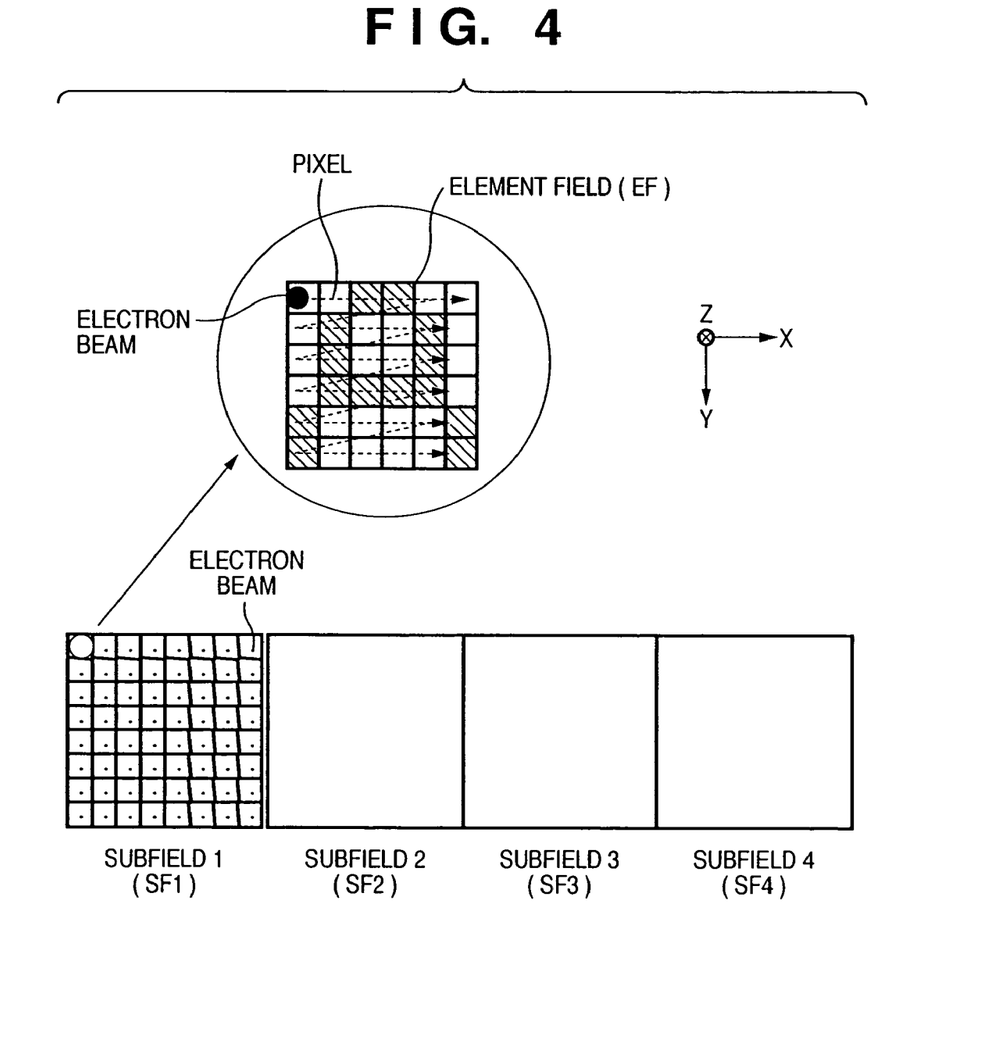
FIG. 4 is a view for explaining an exposure method according to this embodiment.

FIG. 4 is a view for explaining an exposure method according to this embodiment. Drawing operation of the apparatus shown in FIGS. 1 and 3 will be described with reference to FIG. 4. The main control system 28 instructs the deflector control circuit 23 on the basis of exposure control data to make the deflector 10 deflect a plurality of electron beams. The main control system 28 also instructs the blanker array control circuit 22 to perform on-off control for the blankers of the blanker array 7 in accordance with whether each pixel on the wafer 9 should be exposed. Each electron beam performs raster scanning exposure for a corresponding element exposure region (EF) on the wafer 9, as shown in FIG. 4. Electron beam element exposure regions (EF) are two-dimensionally juxtaposed to each other, and a subfield (SF) comprising a plurality of element exposure regions (EF) to be simultaneously exposed is exposed.

In one example, the number of electron beams derived from the aperture array 5 is 32×32=1,024. Each electron beam draws an element exposure region (EF) of about 2 µm square. The diameter of one electron beam on the wafer is about 60 nm. 1,024 (=32×32) element exposure regions constitute one subfield (SF). The size of one subfield (SF) is about 64 µm square.

After the main control system 28 exposes one subfield (SF1), it instructs the deflector control circuit 23 to make the deflector 10 deflect a plurality of electron beams in order to exposure the next subfield (SF2). At this time, a change in subfield due to the deflection causes a change in aberration generated when each electron beam is reduced and projected through the reduction electron optical system 8. The second stigmator control circuit 24 performs correction in accordance with instructions from the main control system 28 such that the astigmatism becomes constant. After a group of about-2-mm-square subfields each comprising a group of 1,024 (=32×32) about-64-µm-square subfields are exposed, the X-Y stage is moved by about 2 mm to exposure the next subfield group.

Although not shown, the deflector 10 comprises a main deflector used when the deflection width is large, and a sub-deflector used when the deflection width is small. The main deflector is a magnetic deflector while the sub-deflector is an electrostatic deflector. The electrostatic sub-deflector scans the element exposure regions while the magnetic main deflector switches between subfields.

(Device Production Method)

An example of a device production method using the above-mentioned electron beam exposure apparatus will be explained.

Figure 7:
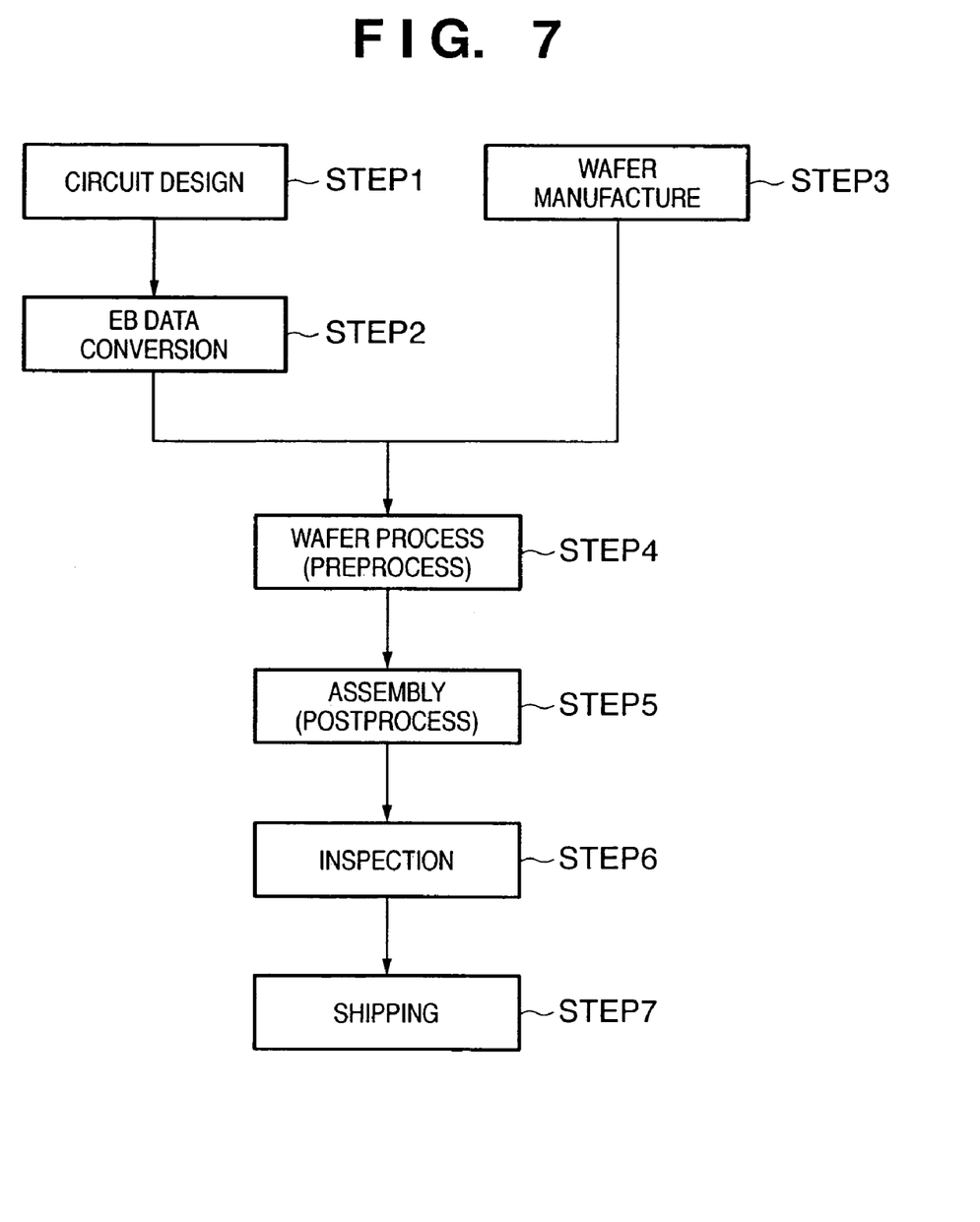
FIG. 7 is a flowchart for explaining the flow of a device manufacturing process.

FIG. 7 shows the manufacturing flow of a microdevice (e.g., a semiconductor chip such as an IC or LSI, liquid crystal panel, CCD, thin-film magnetic head, micromachine, or the like). In step 1 (circuit design), a semiconductor device circuit is designed. In step 2 (exposure control data creation), exposure control data for an exposure apparatus is created based on the designed circuit pattern. In step 3 (wafer manufacture), a wafer is manufactured by using a material such as silicon. In step 4 (wafer process) called a preprocess, an actual circuit is formed on the wafer by lithography using the prepared wafer and the exposure apparatus, into which the exposure control data is input. Step 5 (assembly) called a postprocess is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test of the semiconductor device manufactured in step 5. After these steps, the semiconductor device is completed and shipped (step 7).

Figure 8:
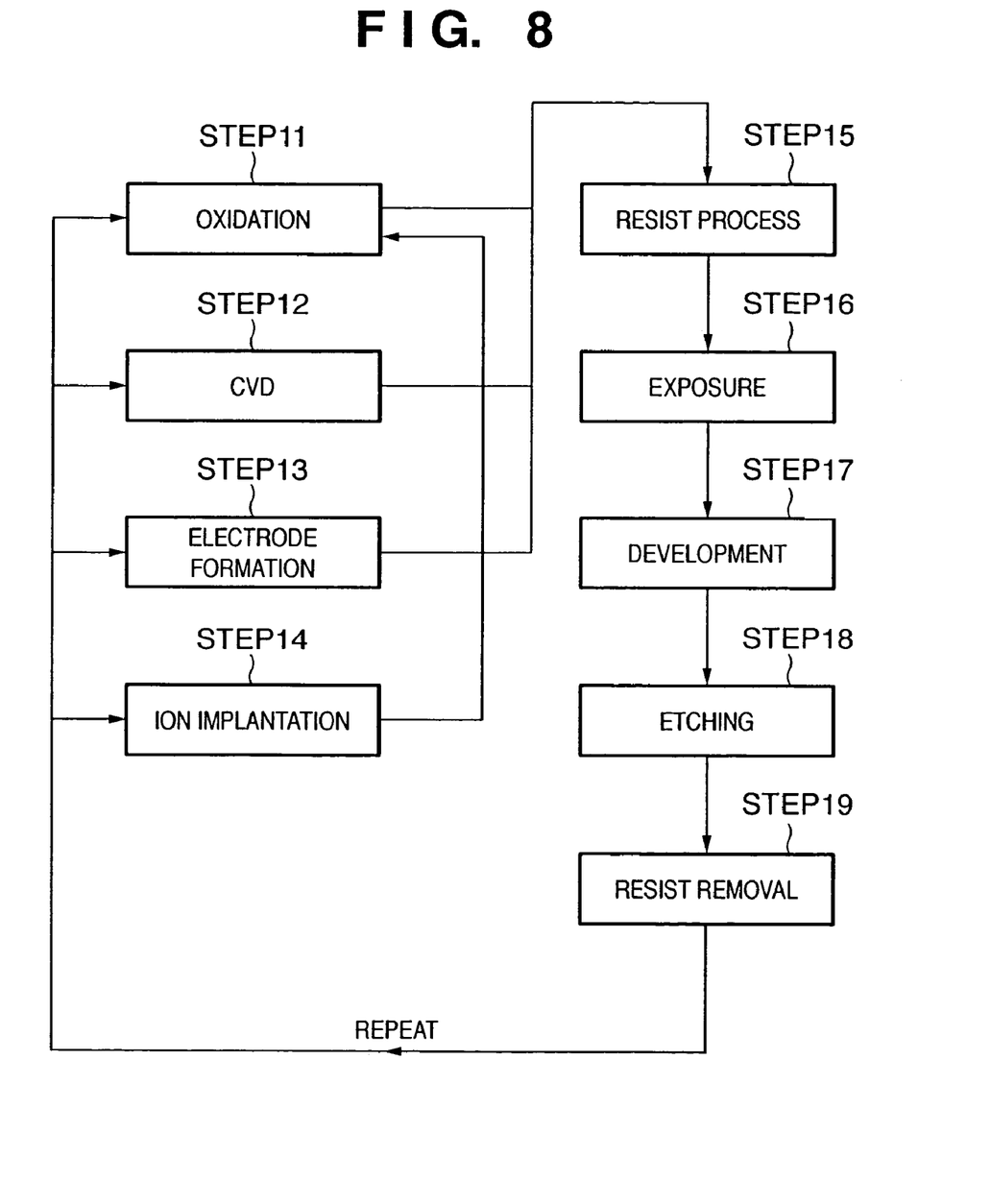
FIG. 8 is a flowchart for explaining the wafer process in FIG. 7.

FIG. 8 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer coated with the photosensitive agent using the above-mentioned exposure apparatus. In step 17 (development), the exposed wafer is developed.

In step 18 (etching), the resist is etched except for the developed resist image.

In step 19 (resist removal), an unnecessary resist after etching is removed.

These steps are repeated to form multiple circuit patterns on the wafer.

With the manufacturing method according to this embodiment, highly integrated semiconductor devices which have been difficult to manufacture by a conventional method can be manufactured at low cost.

The above-mentioned embodiment has explained a case wherein the present invention is applied to a multi-electron beam exposure apparatus which performs drawing with a plurality of electron beams. The present invention may be applied to a case wherein a single electron beam is used to perform drawing. In this case, an image of the electron beam with stable intensity distribution can be projected onto the wafer 9 without being much influenced by a variation in center position of electron beams which come into the aperture of a blanking aperture stop in an electron beam on state. Also, the wafer 9 can be exposed to a desired fine pattern.

As has been described above, according to the present invention, there can be provided a charged particle beam exposure method and charged particle beam drawing apparatus which apply/do not apply charged particle beams to expose a substrate by deflecting the charged particle beams to move them on a blanking aperture stop, wherein exposure to a desired pattern can be performed even when electron beams are not located at the center of the aperture of the blanking aperture stop. With this method, devices with higher yields can be manufactured.

As many apparently widely different embodiments of the present invention can be made without departing from the spirit and scope thereof, it is to be understood that the invention is not limited to the specific embodiments thereof except as defined in the claims.

What is claimed is:

1. A charged particle beam exposure method of controlling irradiation of a substrate with a charged particle beam, comprising the steps of:
    emitting a charged particle beam with a charged particle beam source;
    forming an intermediate image of said charged particle beam source with a first electron optical system;
    performing on-off control of the charged particle beam with a deflector, wherein an on-state is achieved by causing the charged particle beam from said first electron optical system not to be deflected, and an off-state is achieved by causing the charged particle beam to be deflected;
    performing passing control of the charged particle beam with a blanking aperture stop having an aperture, the charged particle beam being passed from the aperture when the charged particle beam is not being deflected by said deflector, the charged particle beam being blocked when the charged particle beam is being deflected by said deflector; and
    projecting the intermediate image formed by said first electron optical system onto the substrate with a second electron optical system by directing the charged particle beam passing through the aperture onto the substrate,
    wherein a size of the charged particle beam on the blanking aperture stop is made larger than a size of an aperture of the blanking aperture stop.

2. A charged particle beam exposure apparatus, comprising:
    a charged particle beam source which emits a charged particle beam;
    a first electron optical system which forms an intermediate image of said charged particle beam source; and
    a second electron optical system which projects the intermediate image formed by said first electron optical system onto the substrate,
    said first electron optical system having
    an electron lens,
    a deflector which deflects a charged particle beam that passes through the electron lens, and
    a blanking aperture stop having an aperture which passes a charged particle beam not deflected by the deflector,
    wherein a size of the charged particle beam on the blanking aperture stop is made larger than a size of an aperture of the blanking aperture stop.

3. The apparatus according to claim 2, wherein said first electron optical system has
    a plurality of electron lenses,
    a plurality of deflectors which deflect a plurality of charged particle beams that pass through the plurality of electron lenses, respectively, and
    a blanking aperture stop having apertures which pass charged particle beams not deflected by said deflectors, and
    a size of each charged particle beam on the blanking aperture stop is made larger than a size of an aperture of the blanking aperture stop.

4. A charged particle beam exposure apparatus, comprising:
    a charged particle beam source which emits a charged particle beam;
    a deflector which deflects the charged particle beam; and
    a blanking aperture stop having an aperture which passes a charged particle beam not deflected by said deflector, and
    wherein a cross-sectional area of the charged particle beam on said blanking aperture stop is made larger than an area of the aperture of said blanking aperture stop.

5. A device manufacturing method comprising:
    an exposure step of exposing a substrate to a pattern using a charged particle beam exposure apparatus as defined in claim 2; and
    a development step of developing the substrate which has been exposed to the pattern in the exposure step.

6. A device manufacturing method comprising:
    an exposure step of exposing a substrate to a pattern using a charged particle beam exposure apparatus as defined in claim 4; and
    a development step of developing the substrate which has been exposed to the pattern in the exposure step.

* * * * *